United States Patent
Carney et al.

[19]

[11] Patent Number: 5,828,220
[45] Date of Patent: Oct. 27, 1998

[54] METHOD AND SYSTEM UTILIZING RADIO FREQUENCY FOR TESTING THE ELECTROMAGNETIC SHIELDING EFFECTIVENESS OF AN ELECTROMAGNETICALLY SHIELDED ENCLOSURE

[75] Inventors: Thomas Lee Carney, Leesburg, Va.; Michael Kent McInerney, Champaign, Ill.

[73] Assignee: The United States of America as represented by the Secretary of the Army, Washington, D.C.

[21] Appl. No.: 505,582

[22] Filed: Nov. 2, 1995

[51] Int. Cl.⁶ .................................................. G01R 31/00
[52] U.S. Cl. ..................... 324/627; 324/639; 174/35 MS
[58] Field of Search ..................................... 324/627, 639; 174/35 MS

[56] References Cited

U.S. PATENT DOCUMENTS

| | | | |
|---|---|---|---|
| 3,492,568 | 1/1970 | Johnson | 324/627 |
| 4,789,829 | 12/1988 | Stribling | 324/263 |
| 4,962,358 | 10/1990 | Svetanoff | 324/627 |
| 5,061,899 | 10/1991 | Kudo | 324/627 |
| 5,068,616 | 11/1991 | Broyde et al. | 324/627 |
| 5,153,524 | 10/1992 | McCormack | 324/627 |
| 5,285,164 | 2/1994 | Wong | 324/628 |
| 5,311,116 | 5/1994 | Rogers | 324/627 |
| 5,414,366 | 5/1995 | Rogers | 324/627 |

*Primary Examiner*—Maura K. Regan
*Attorney, Agent, or Firm*—Luther A. Marsh

[57] ABSTRACT

A system and method for continuously monitoring the shielding effectiveness of an electromagnetically shielded enclosure is disclosed including an RF transmitter positioned remote from the shielded enclosure. RF signals emitted from the remotely positioned transmitter are received by both an enclosure receiver positioned inside of the enclosure and simultaneously by a reference receiver having its antenna positioned outside of the shielded enclosure. These two received signals are mixed so as to produce IF signals which are subsequently forwarded to a synchronous detector which determines the ratio of the two signal levels by comparing their strengths. This ratio is indicative of the enclosure's electromagnetic shielding effectiveness. If the effectiveness drops below a predetermined or threshold limit, such is determined by a comparator positioned within the enclosure and an alarm may be sounded so as to indicate that the shield is failing. Accordingly, the effectiveness of the electromagnetic shield may be monitored twenty-four hours a day. It is also noted that the remotely positioned transmitter may be that of an existing radio station according to certain embodiments of this invention.

6 Claims, 1 Drawing Sheet

METHOD AND SYSTEM UTILIZING RADIO FREQUENCY FOR TESTING THE ELECTROMAGNETIC SHIELDING EFFECTIVENESS OF AN ELECTROMAGNETICALLY SHIELDED ENCLOSURE

This invention relates to a method and system for testing the electromagnetic shielding effectiveness of an electromagnetically shielded enclosure. More particularly, this invention relates to a method and system which utilizes an unattached, independent radio frequency source for continually monitoring the shielding effectiveness of an electromagnetically shielded enclosure.

BACKGROUND OF THE INVENTION

In testing radio frequency (RF) or other frequency sensitive electronic equipment, it is often necessary to make tests within a room shielded against radio frequency (RF) or other electromagnetic signals in order to prevent extraneous signals from interfering with the measurements being made. Additionally, electromagnetic or RF shielded enclosures are provided for other reasons known in the art. Also in order for tests to be made on this installation, systems sometimes have to be shut down to test of shielding can be made.

Electromagnetically shielded enclosures (i.e. rooms, chambers, etc.) need to be tested or monitored in order to measure the effectiveness of the electromagnetic shield. Due to normal deterioration of typical enclosure shielding components (from corrosion for example) and to catastrophic changes (e.g. drilled or punched holes), the electromagnetic shielding effectiveness of an enclosure changes over time, generally in a decreasing or deteriorating direction.

Typically, the shielding effectiveness of such electromagnetically shielded enclosures is determined by way of conducting specialized shielding effectiveness tests. Such tests, due to their complexity and required procedural expertise, are typically conducted infrequently, thus allowing for the possibility that a degraded or failing shield could be in place over an extended period of time without being detected.

Conventional electromagnetic shielding tests require the use of signal generators, amplifiers, antennas, and receivers (the signal generator and receiver may be combined into one unit termed a network analyzer—unfortunately, however, most network analyzers do not have the signal input sensitivity of receivers and may require a preamplifier). Cabling may also be used in conventional testing systems and methods thereby increasing the complexity and expense of conducting such tests.

Additionally, because conventional shielding effectiveness tests do not employ synchronous detection, a high powered signal must be transmitted if there is electromagnetic noise present inside of the enclosure in order to obtain enough signal power to overcome such noise. Unfortunately, such high power levels tend to create interference in unshielded equipment located near the transmitter which is, of course, a problem. It is undesirable to have to send such high power levels solely for the test.

U.S. Pat. No. 3,492,568 discloses a method and system for measuring the radio frequency (RF) shielding affectivity of an enclosure by using an RF transmitter connected to the enclosure and an RF receiver disposed within or without the enclosure so as to sense surface current at leakage points. This patent couples radio frequency energy to the walls of the shielded enclosure by connecting the output of the RF transmitter between selected points on the enclosure. The radio frequency energy circulates around the surface of the enclosure to provide substantially uniform distribution thereof. A portable RF receiver having an antenna and an output indicator indicating the level of the signals receives is used to scan the wall surfaces of the enclosure opposite the surfaces on which the RF energy is distributed. Thus, leakage points in the shield are indicated by a rise in the input to the receiver as indicated on its output indicator. Unfortunately, the system of this patent requires the coupling of the RF transmitter to the enclosure, this requirement being unduly burdensome and time consuming. Furthermore, the receiver of this system needs to be moved around within or without the enclosure thereby necessarily requiring either manpower or a device near the enclosure to move and monitor the receiver.

U.S. Pat. No. 5,153,524 discloses a system and method for testing the electromagnetic shielding effectiveness of a shielded enclosure. The method of this patent includes sequentially driving four diagonally opposite corner pairs of the enclosure with an RF signal, measuring the radio frequency or RF energy leakage for each corner pair, and averaging the four measured RF leakage levels to obtain an average RF energy leakage level. This average RF energy leakage level is then compared with prior measured levels to obtain an indication of the RF energy shielding effectiveness. Unfortunately, the system and method of this patent (i.e. U.S. Pat. No. 5,153,524) also requires connecting wires from the RF source to opposite corners on the exterior of the shielded enclosure. This requirement is extremely burdensome and expensive. It also takes up valuable space outside of the enclosure.

U.S. Pat. No. 5,068,616 discloses a monitoring process and device of a quasi-closed electromagnetic shield. In this patent, an emitter of low power electromagnetic signals with random or pseudo-random frequency variation is located inside an electromagnetic shield to be monitored. The emitted signals are detected by at least one synchronous detection receiver located outside the shield. A second transmission channel (e.g. an optical fiber) connects the emitter and receiver assemblies so as to enable synchronous detection of signals transmitted via an electromagnetic channel through the shield. The amplitude of the signals received by the detector indicates the quality of the shielding. Unfortunately, a separate transmitter or emitter is required to be positioned within the electromagnetically shield structure according to this patent and a second channel such as a cable is needed. This emitter significantly increases the expense and space taken up by the system.

It is apparent from the above that there exists a need in the art for a less expensive system and method for monitoring the effectiveness of an electromagnetic shield shrouding an enclosure. A system and method is needed which continually detects the effectiveness of the shield over an extended period of time by way of synchronous signal detection.

SUMMARY OF THE INVENTION

Generally speaking, this invention fulfills the above-described needs in the art by providing a method of continuously measuring the shielding effectiveness of an electromagnetically shielded enclosure, the method comprising the steps of:

a) continuously transmitting a radio frequency (RF) signal through atmospheric free space at any turnable frequency of the receiver from a location remote from the electromagnetically shielded enclosure;

b) receiving the continuously transmitted RF signal by way of a reference receiver having its receiving antenna positioned outside of the enclosure, the signal received by the reference receiver being a reference signal;

c) receiving the continuously transmitted RF signal by way of an enclosure receiver positioned within the shielded enclosure, the signal received by the enclosure receiver being an enclosure signal;

d) continuously computing the ratio, in a synchronous detector, of the received reference signal versus the received enclosure signal, this ratio be indicative of the shielding effectiveness of the electromagnetic shield of the enclosure; and e) determining the electromagnetic shielding effectiveness by analyzing the computed ratio.

In certain preferred embodiments of this invention, the above-recited steps c), d), and e) are carried out within the enclosure.

This invention further fulfills the above-described needs in the art by providing a system for continuously monitoring the shielding effectiveness of an electromagnetically shielded enclosure, the system comprising:

an electromagnetically shielded enclosure;

a radio frequency (RF) transmitter located remote from the shielded enclosure for continuously broadcasting RF signals through atmospheric free space at several predetermined frequencies: Any continually transmitting system can be used, be it broadcast AM<FM, TV, or airport equipment like VORTAC, TACAN, beacons, etc., a reference receiver, located in or adjacent the shielded enclosure, for continuously receiving new broadcast RF signals by way of an antenna positioned outside of the shielded enclosure, the signal received by the reference receiver being a reference signal;

an enclosure receiver located within the shielded enclosure for continuously receiving the broadcast RF signals by way of an antenna also located inside of the shielded enclosure, the signal received by the enclosure receiver being an enclosure signal;

at least one master oscillator located within the shielded enclosure controlling the receivers to obtain the received reference signals and the received enclosure signals thereby producing reference IF signals and enclosure IF signals; and a synchronous detector located within the shielded enclosure for continuously determining the ratio of the reference IF signals versus the enclosure IF signals, the continuously determined ratio being indicative of the shielding effectiveness of the electromagnetically shielded enclosure.

This invention will now be described with reference to certain embodiments thereof as illustrated in the following drawings.

IN THE DRAWINGS

FIG. 1 is a block diagram illustrating the circuitry and shielded enclosure of the system and method for measuring the shielding effectiveness of an electromagnetic shielding device for an enclosure according to an embodiment of this invention.

DETAILED DESCRIPTION OF CERTAIN EMBODIMENTS OF THIS INVENTION

Figure 1:
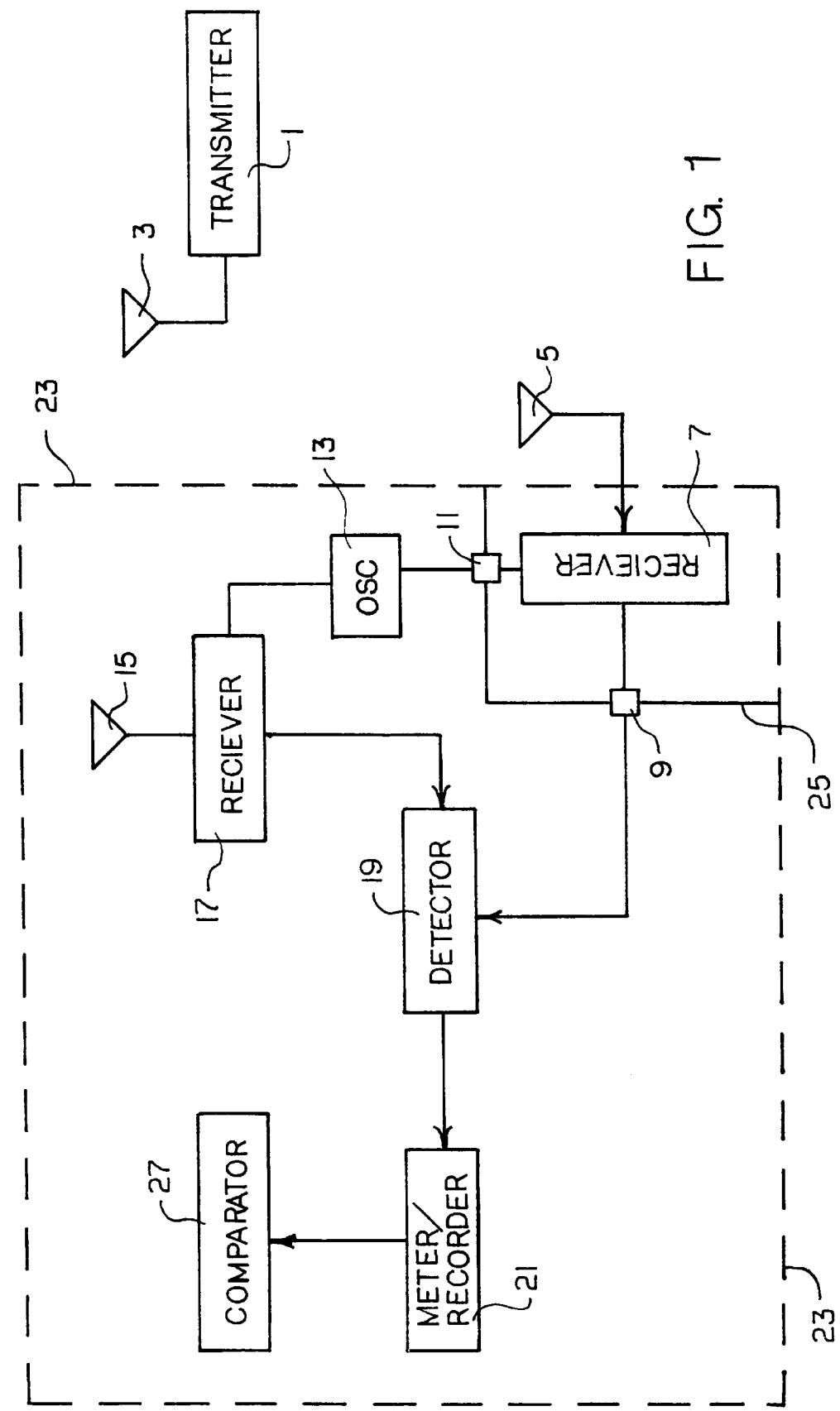

FIG. 1 is a block diagram of a system/method for measuring the shielding effectiveness of an electromagnetically shielded enclosure according to an embodiment of this invention. Illustrated in FIG. 1 are radio frequency (RF) transmitter 1, transmitting antenna 3, receiving antenna 5, reference receiver 7, filters 9 and 11, master oscillator(s) 13, enclosure receiving antenna 15, enclosure receiver 17, synchronous detector 19, meter/recorder 21, electromagnetically shielded enclosure 23, shielded box or chamber 25 which houses receiver 7, and comparator 27 including an alarm.

Transmitter 1 is remotely located from electromagnetically shielded enclosure 23. Transmitter 1 may be, for example, a commercial radio frequency (RF) transmitter which transmits any type of continuous RF signal, made or otherwise. In other words, transmitter 1 may be represented by currently existing commercial transmitters, be they broadcast transmitters (AM, FM, or TV), VORTACS, TACANS at airports, beacons, doppler systems, any types of continuously transmitted signals. The use of an existing transmitting system for a transmitter 1 (and antenna 3) reduces the overall cost of the system/method according to certain embodiments of this invention and allows continuous testing (without the need for personnel) around the clock.

Alternatively, transmitter 1 may transmit very high frequency (VHF) or ultra high frequency (UHF) signals. UHF is the band of frequencies encompassing 300–3,000 MHz. VHF is the band of frequencies encompassing 30–300 MHz. Any other type of conventional RF transmitter may be used.

In certain embodiments of this invention, transmitter 1 is a currently existing FM radio station. In such embodiments, the combined baseband frequency modulates a wave within transmitter 1. The modulated wave within transmitter 1 is at an intermediate frequency (IF) or is converted to an IF, and thence up-converted to the output frequency. The up-converted signal is applied directly to transmitting antenna system 3 for wireless radiation through atmospheric free space or for further amplification and then wireless radiation (i.e. transmission). Accordingly, transmitter 1 and antenna 3 continually transmit signals at a substantially constant or predetermined frequency through atmospheric free space in a wireless manner.

Accordingly, RF transmitter 1 and antenna 3 are remotely located from electromagnetically shielded enclosure 23 in certain embodiments. However, it is important that RF antenna 5 and RF antenna 15 located at shielded enclosure 23 be within receiving range of the signals transmitted by RF transmitter 1 and antenna 3.

Reference receiver 7 and enclosure receiver 17 are conventional RF receivers. Clearly, receivers 7 and 17 are designed in accordance with the frequency transmitted by RF transmitter 1 and antenna 3. Thus, receivers 7 and 17 may receive AM, FM, VHF, UHF, etc. type signals depending upon the frequency transmitted by transmitter 1.

In certain embodiments of this invention, receivers 7 and 17 are typical RF, receivers. In such embodiments, from a manifold or via a circulator and/or pre-selector within receivers 7 and 17, the incoming FM signals proceed into a mixer or down converter. Receivers 7 and 17 heterodyne the received FM signals with a local oscillator signal from oscillator(s) 13 to produce an intermediate frequency (IF). For example, the IF may be from about 50–150 MHz (e.g. 70 MHz). Either one or two local oscillator 13 may be used.

From the mixer or down converter output within receivers 7 and 17, the IF from each receiver in certain embodiments is conventionally fed through several amplification stages, often through a phase equalizer to correct delayed distortion introduced by IF filters. IF gains are commonly in the order of about 90–100 dB as is known in the art. The output IF from receivers 7 and 17 is fed to RF detector 19 is adjustable for phase shifts in the frequency used at that time and which is of the synchronous type.

Synchronous detector 19 uses a standard synchronous detection scheme to detect the signal level of both the reference IF signal from reference receiver 7 and the enclosure IF signal from enclosure receiver 17. The ratio of the signal levels of the reference IF from receiver 7 versus the enclosure IF from receiver 17 is then computed and scaled so as to produce a reading of the enclosure's electromagnetic shielding effectiveness on meter/recording device 21. The ratio computation and scaling of the IF signals from receivers 7 and 17 may take place within detector 19. Thus, the electromagnetic shielding effectiveness (SE) of enclosure 23 is defined as $$SE = 20 \log \cdot \left( \frac{E_{OUTSIDE}}{E_{INSIDE}} \right)$$

where $E_{OUTSIDE}$ is the electric field intensity outside enclosure 23 and $E_{INSIDE}$ is the electric field intensity inside enclosure 23.

Thus, by utilizing the ratio of the two different signals received from transmitter 1, the effectiveness of the electromagnetic shield of enclosure 23 may be determined. Meter/recorder 21 is forwarded a scaled signal indicative of the shielding effect, the scaled signal having been determined by detector 19. Meter/recorder 21 then forwards this received signal to comparator 27 which compares the measured shielding effectiveness with a reference or stored threshold shielding effectiveness which must be met. If the measured shielding effectiveness of the shield of enclosure 23 is below that of the threshold required effectiveness, then comparator 27 determines this, and in turn, outputs an alarm signal indicative of the fact that the electromagnetic shield of enclosure 23 is failing (i.e. it is below the threshold level).

Alternatively, if the shielding effectiveness measured by detector 19 and output to meter/recorder 21 is at or above the threshold effectiveness level stored within comparator 27, then comparator 27 does not output an alarm signal. It is noted that meter/recorder 21 may continually display either within or without enclosure 23 the measured shielding effectiveness of the electromagnetic shield of enclosure 23 so that operators monitoring the shield may see its current effectiveness at any time.

Reference receiver 7 is enclosed within shielding box 25 in certain embodiments of this invention so as to prevent the externally transmitted RF signals from transmitter 1 from directly entering electromagnetically shielded enclosure 23. Shielded box 25 as illustrated in FIG. 1 is disposed within enclosure 23. However, in certain alternative embodiments, shielded box 25 may be disposed outside of enclosure 23.

Conventional filters 9 and 11 prevent unwanted signals from exiting box 25 and entering the interior of shielded enclosure 23. Filters 9 and 11 are, of course, disposed along the interface defined between shielded box 25 and shielded enclosure 23 regardless of whether or not box 25 is disposed within or without shielded enclosure 23.

Because transmitter 1 may be, for example, a currently existing transmitting radio station, the shielding effectiveness monitor or method according to certain embodiments of this invention does not require special equipment or specially trained personnel in order to continuously carry out testing of the electromagnetic shielding effectiveness of enclosure 23. Further, because an external RF signal is supplied by transmitter 1, the method/system according to certain embodiments of this invention may remain in operation twenty-four hours a day in view of the fact that most commercial radio broadcast stations operate around the clock. Accordingly, continuous monitoring is provided in certain embodiments.

While RF transmitter 1 and antenna 3 may be part of a currently existing radio broadcasting station, these elements may be part of a specifically designated RF source positioned near enclosure 23 in certain other embodiments of this invention. Such other embodiments would allow transmitter 1 and antenna 3 to continuously emit signals having lower power level requirements due to the low power level requirements of the synchronous detection scheme according to certain embodiments of this invention.

In a typical operation of the system/method according to certain embodiments of this invention, the electromagnetic shielding effectiveness of enclosure 23 is continuously monitored (i.e. for extended periods of time without interruption. Transmitter 1 and antenna 3 emit or broadcast signals at a predetermined frequency (e.g. RF) around the clock. Reference receiver 7 and reference antenna 5 receive the signals from transmitter 1 and antenna 3 outside of enclosure 23. Meanwhile, enclosure receiver 17 and antenna 15 receive the signals broadcast by transmitter 1 within or inside of enclosure 23. Thus, receiver 7 acts as a reference receiver while receiver 17 functions as an enclosure receiver. The reference signals received by antenna 5 and receiver 7 are forwarded to synchronous detector 19 after they are mixed by a conventional oscillator signal from oscillator 13 thereby producing a reference IF signal. Likewise, the enclosure signal from receiver 17 is also mixed with a signal from master oscillator 13 this oscillator synchronizes the loss of both receivers through PLL techniques. (or another separate local oscillator) so as to create an enclosure IF signal. It is noted that different oscillators 13 may be used for the different receivers, or alternatively, a single oscillator 13 may be provided.

Thus, synchronous detector 19 receives the enclosure IF signal from receiver 17 and the reference IF signal from receiver 7. The ratio of the signal levels of the two IF signals is then computed within detector 19 and scaled so as to produce a reading indicative of enclosure 23's electromagnetic shielding effectiveness. This effectiveness is portrayed by or displayed way of meter/recorder 21.

The current measured shielding effectiveness is then forwarded to comparator 27 which determines whether or not the current measured effectiveness is below the threshold or required level which is stored within comparator 27. If it is below the threshold level, then an alarm may be sounded so as to indicate that the shield is failing. If it is not below the threshold effectiveness level, no alarm is sounded.

Accordingly, the electromagnetically shielding effectiveness is continuously monitored in certain embodiments, with the current effectiveness always being obtainable by an operator via meter/recorder 21. An operator may either view meter 21 within or without enclosure 23.

Once given the above disclosure, therefore, various other modifications, features or improvements will become apparent to the skilled artisan. Such other features, modifications and improvements are thus considered a part of this invention, the scope of which is to be determined by the following claims:

We claim:

1. A method of continuously measuring the shielding effectiveness of an electromagnetically shielded enclosure, the method comprising the steps of:

a) continuously transmitting a radio frequency (RF) signal through atmospheric free space at a predetermined frequency from a location remote from said electromagnetically shielded enclosure;

b) receiving said continuously transmitted RF signals by way of a reference receiver having its receiving antenna positioned outside of said enclosure, the signals received by said reference receiver being reference signals;

c) receiving said continuously transmitted RF signals by way of an enclosure receiver positioned within said shielded enclosure, the signals received by said enclosure receiver being enclosure signals;

d) continuously computing the ratio, in a comparator, of the received reference signals versus the received enclosure signals, these ratios being indicative of the shielding effectiveness of the electromagnetic shield of said enclosure; and e) determining the electromagnetic shielding effectiveness by analyzing said computed ratios.

2. The method according to claim 1, wherein the recited steps c), d), and e) are carried out within said enclosure.

3. The method according to claim 2, wherein steps b) and c) further include mixing said received signals so as to produce received reference IF signals and received enclosure IF signals which are forwarded to said synchronous detector.

4. The method according to claim 3, further comprising the steps of positioning said reference receiver within a shielded box adjacent said enclosure so that the transmitted RF signals are prevented from entering said shielded enclosure other than through the shield itself.

5. The method according to claim 3, wherein step a) is carried out from an existing broadcasting commercial radio station twenty-four hours a day.

6. A system for continuously monitoring the shielding effectiveness of an electromagnetically shielded enclosure, the system comprising:

an electromagnetically shielded enclosure;

a radio frequency (RF) transmitter located remote from said shielded enclosure for continuously broadcasting RF signals through atmospheric free space at a predetermined frequency;

a reference receiver, located in or adjacent said shielded enclosure, for continuously receiving said broadcast RF signals by way of an antenna positioned outside of said shielded enclosure, the signals received by said reference receiver being reference signals;

an enclosure receiver located within said shielded enclosure for continuously receiving said broadcast RF signals by way of an antenna also located inside of said shielded enclosure, the signals received by said enclosure receiver being enclosure signals;

at least one oscillator located within said shielded enclosure for controlling both receivers' LDs signals and said received enclosure signals thereby producing reference IF signals and enclosure IF signals; and a synchronous detector located within said shielded enclosure for continuously determining the ratio of said reference IF signals versus said enclosure IF signals, said continuously determined ratios being indicative of the shielding effectiveness of said electromagnetically shielded enclosure.

* * * * *